United States Patent [19]
Garvens

[11] Patent Number: 5,358,774
[45] Date of Patent: Oct. 25, 1994

[54] ELECTROMAGNETIC SHIELDING ASSEMBLY AND FABRICATION METHOD

[75] Inventor: Thomas E. Garvens, Streamwood, Ill.

[73] Assignee: Motorola, Inc., Schaumburg, Ill.

[21] Appl. No.: 52,873

[22] Filed: Apr. 26, 1993

[51] Int. Cl.$^5$ .............................................. B32B 9/00
[52] U.S. Cl. .................... 428/209; 428/408; 428/901; 428/131; 428/132
[58] Field of Search .............. 428/209, 210, 901, 67, 428/408, 131, 132; 361/748, 750, 751

[56] References Cited

U.S. PATENT DOCUMENTS

| | | | |
|---|---|---|---|
| 4,684,560 | 8/1987 | Minten et al. | 428/408 |
| 4,878,152 | 10/1989 | Sauzade et al. | 428/209 |
| 4,963,414 | 10/1990 | LeVasseur et al. | 428/195 |
| 4,990,393 | 2/1991 | Shibano et al. | 428/209 |
| 4,992,139 | 2/1991 | Suppelsa et al. | 428/209 |

Primary Examiner—Patrick J. Ryan
Assistant Examiner—Patrick R. Jewik
Attorney, Agent, or Firm—Timothy W. Markison

[57] ABSTRACT

An electromagnetic shielding assembly comprises a substrate, an electrically conductive carbon composition shielding plate, and a metallic plate, wherein the electrically conductive carbon composition plate is physically and electrically coupled to the substrate and the metallic plate. By positioning the substrate such that a circuit that emits, or is sensitive to, electromagnetic energy is substantially enclosed within a cutout area of the electrically conductive carbon composition plate, the electromagnetic shielding assembly substantially contains the electromagnetic energy radiating from, or towards, the circuit.

14 Claims, 2 Drawing Sheets

ELECTROMAGNETIC SHIELDING ASSEMBLY AND FABRICATION METHOD

FIELD OF THE INVENTION

This invention relates generally to electromagnetic shields and, in particular, to an electromagnetic shielding assembly.

BACKGROUND OF THE INVENTION

Electromagnetic shields are generally constructed of a metallic material and are positioned around radiating components to constrain electromagnetic fields produced by the radiating components. By shielding the radiating components, which may be microstrip transmission lines or surface mount electrical components, the electromagnetic energy emitting from them will not cause undesired effects in neighboring circuitry or equipment. Alternatively, electromagnetic shields may be positioned around components which are sensitive to electromagnetic energy to minimize their exposure to unwanted electromagnetic fields. Due to the malleability of metallic materials, the shields may have almost any geometric shape which allows for convenient electromagnetic isolation of radiative circuitry or equipment from susceptible circuitry or equipment.

The metallic materials typically used for an electromagnetic shield are copper or stainless steel. These metals are selected primarily due to their inherently high values of conductivity which effectively restricts the flow of radiated electromagnetic energy. Although metallic electromagnetic shields typically provide effective electromagnetic shielding, they are limited by the effectiveness of the peripheral seal which seals the shield around the affected component.

Attachment of metallic shields to various substrate materials has certain limitations. Typically, metallic shields, which are incorporated on printed circuit boards, require small apertures located about their peripheral to allow reliable attachment of the shields to the printed circuit boards. Depending on the number and separation of the apertures, the metallic shields leak electromagnetic energy from the spaces between the apertures. Additionally, metallic shields typically have thermal coefficients of expansion in the range of 14 ppm/° C. to 24 ppm/° C. which limits the types of substrate materials the metallic shields can be soldered to and still maintain solder joint integrity over deviations in ambient temperatures. Further, attachment of metallic shields to various substrate materials is generally an unreliable and tedious procedure due to the added parts associated with the shield and due to the necessity that the shield's cover be attached after the substrate is solder reflowed. Attachment of the shield's cover prior to solder reflow is prohibited because solder joint integrity of the enclosed circuits could be compromised.

Recent technological advances have allowed electromagnetic shields to be fabricated from a printed circuit board. For a detailed discussion of fabricating shields from printed circuit boards refer to pending U.S. Patent application No. 07/806382, entitled "RF Shield Fabrication Method", assigned to Motorola Inc. While this technology provides many advantages, it does not address the technological concern of having different materials for the substrate and the electromagnetic shield.

Therefore, a need exists for an electromagnetic shielding assembly that allows complete enclosure of an electrical circuit on a substrate of a different material than an electromagnetic shield and that reduces the fabrication complexity of an assembly which includes the shield and the circuit.

DESCRIPTION OF A PREFERRED EMBODIMENT

Generally, the present invention provides an electromagnetic (EM) shielding assembly that utilizes an electrically conductive carbon composition shielding plate. The shielding plate includes a cutout area large enough to surround a circuit that is sensitive to, or radiates, electromagnetic energy (EME). A substrate, that has the circuit deposited on one side and a metallic shielding area adhered to the other side, is attached to one surface of the shielding plate such that the circuit is positioned within the cutout area. In this configuration, the shielding plate essentially forms the walls of an EM shield around the circuit. The metallic shielding area and a metallic plate coupled to a second surface of the shielding plate constitute the remaining elements of the EM shielding assembly such that the assembly provides a complete EM enclosure around the circuit.

Figure 1:
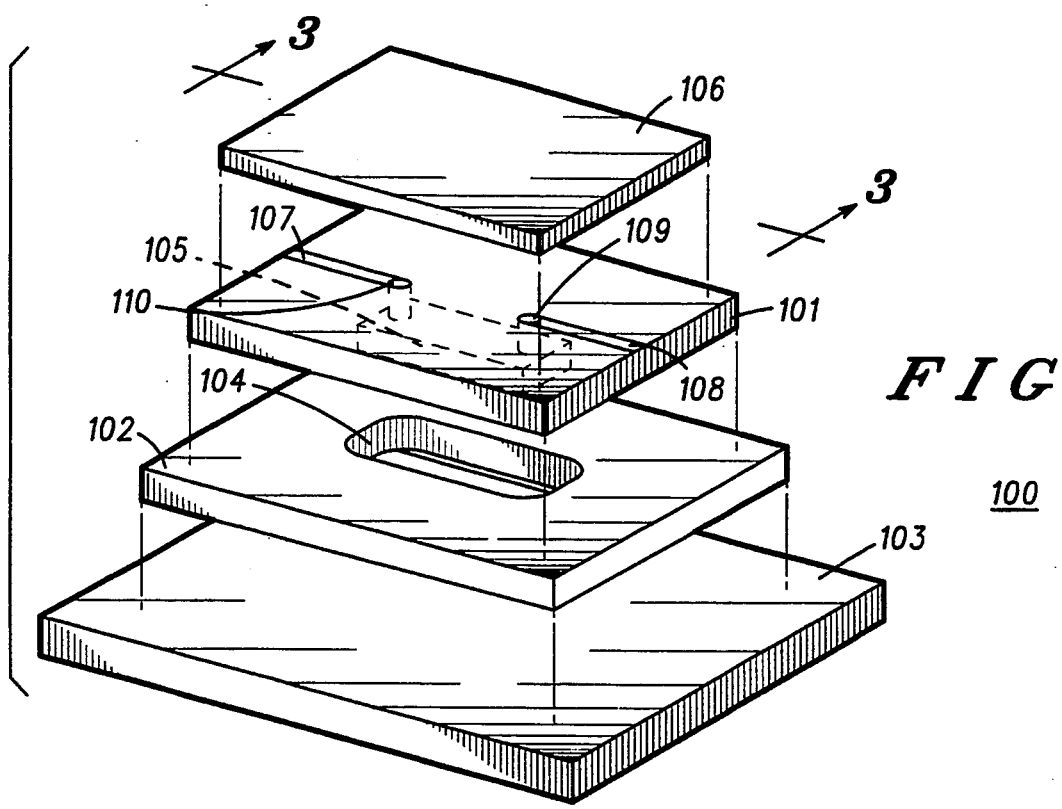
FIG. 1 illustrates an exploded frontal view of an electromagnetic shielding assembly in accordance with the present invention.

The present invention can be more fully described with references to FIGS. 1-5. FIG. 1 illustrates an exploded frontal view of an EM shielding assembly 100 that includes a substrate 101, an electrically conductive carbon composition shielding plate 102, a metallic plate 103, and a metallic shielding area 106. Deposited on a first major surface of the substrate 101 is a circuit 105 that emits, or is sensitive to, EME. Adhered to a second major surface of the substrate 101 is the metallic shielding area 106 which provides the cover for the EM shield. The substrate 101 may also include an input trace 107 and an output trace 108 deposited on the surface which contains the metallic shielding area 106, such that electrical isolation is maintained between the traces 107 and 108 and the metallic shielding area 106. Electrically conductive feedthrough holes 109 and 110 couple the traces 107 and 108 to the circuit 105. The shielding plate 102 includes a cutout area 104 large enough to encase the circuit 105 upon complete fabrication of the EM shielding assembly 100.

The substrate 101 and its associated elements may be fabricated in a variety of ways. The substrate 101 may comprise a printed circuit board or a ceramic material, such as alumina ($Al_2O_3$). The substrate 101 can support various modes of electromagnetic propagation when a dielectric material, such as polyimide, teflon, or alumina, is used in its construction. Typical thickness of an alumina substrate is in the 0.635 mm to 1.27 mm range. The metallic shielding area 106, the input trace 107, the output trace 108, and the feedthrough holes 109 and 110 typically comprise high conductivity metals, such as copper or silver, to provide electrical continuity with minimum signal attenuation. Thicknesses of these metallic areas depend on frequency of operation and thermal conductivity of the substrate 101, but typically these areas are less than 0.0762 mm thick. The metallic shielding area 106 may have any predetermined geometric shape, but the rectangular geometry depicted in FIG. 1 is most common. The circuit 105, which may be sensitive to, or radiates, EME typically comprises various known elements depending on its function. Accordingly, the size and shape of the circuit 105 vary to accommodate functionality, but typical dimensions may be 75 mm long × 50 mm wide × 3.12 mm high.

Formation of the shielding plate 102, which includes the cutout area 104, may be accomplished in various manners with certain limitations. The material used to fabricate the shielding plate is an electrically conductive carbon composition, which may be graphite, a copper impregnated graphite, or a composite graphite impregnated with high temperature organic materials. Since the cutout area 104 in the shielding plate 102 forms a continuous wall for the EM shield, thickness of the shielding plate 102 is critical to circuit function and should be greater than the circuit 105 height. Length and width of the shielding plate 102 should be dimensionally adequate to support the substrate 101. Size and shape of the cutout area 104 vary to accommodate the circuit 105, but an elliptical or rectangular geometry is preferred for its ease of machining. A typical graphite shielding plate may be 12.7 cm long × 8.9 cm wide ×0.625 cm high and include a geometrically centered elliptical cutout area with a major axis length of 8.9 cm and a minor axis length of 6.4 cm.

The metallic plate 103 functions as the base of the EM shield in the EM shielding assembly 100 and may comprise any medium to high conductivity metal, such as aluminum or copper. Size and shape of the metallic plate 103 depend on frequency requirements of the circuit 105, dimensions of the electrically conductive carbon composition shielding plate 102, and whether the metallic plate 103 is used for additional functions, such as a backplane of a heat sink. Typical dimensions for the metallic plate 103 may be 25.4 cm long × 20 cm wide × 0.625 cm high.

Figure 2:
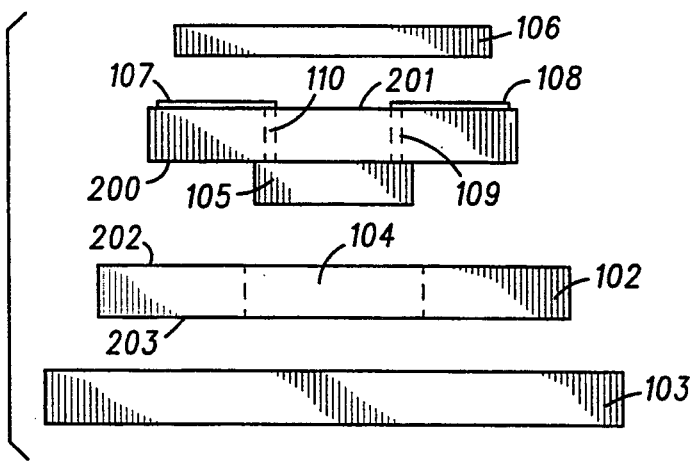
FIG. 2 illustrates an exploded cross-sectional view of an electromagnetic shielding assembly in accordance with the present invention.

FIG. 2 illustrates an exploded cross-sectional view of the EM shielding assembly 100 and displays first and second major surfaces of the substrate 101 and the shielding plate 102. From this view, the first major surface 200 of the substrate 101 has the circuit 105 deposited thereon. The circuit 105 may include discrete or integrated electrical components and be utilized for DC or high frequency applications. Types of circuits that may be shielded using the present invention include low power active or passive circuits that are sensitive to electromagnetic energy, such as mixers or oscillators, and high power active or passive circuits that radiate electromagnetic energy, such as amplifiers and filters. This view also shows the second major surface 201 of the substrate 101. The metallic shielding area 106 is typically adhered to the second major surface 201 by using an electrically conductive bonding agent (not shown), such as solder or conductive epoxy, or by being deposited thereon. The metallic shielding area 106 may be electrically coupled to the shielding plate 102 via conductive traces wrapped around the edge of the substrate 101 or through additional plated feedthrough holes in the substrate 101. If necessary, the input and output traces 107 and 108 are deposited on the second major surface 201 such that there is substantial electrical isolation between the metallic shielding area 106 and the two traces 107 and 108. For example, if both the traces 107, 108 and the metallic shielding area 106 are deposited on the second major surface 201 of the substrate 101, air gaps between each trace 107, 108 and the metallic shielding area 106 would be included to insure electrical isolation. The circuit 105 and the input and output traces 107, 108 are deposited on the substrate 101 in a known manner, thus no further discussion will be presented except to facilitate the understanding of the invention.

As briefly mentioned above, the shielding plate 102 includes first and second major surfaces 202 and 203 that are used to mate the substrate 101 and the metallic plate 103 to the shielding plate 102. Typically, the substrate 101 is attached to the first surface 202 via an electrically conductive bonding agent (not shown), such as solder or conductive epoxy, and the metallic plate 103 is coupled to the second surface 203 using mechanical fasteners, (such as clips or screws), an electrically conductive bonding agent, or by depositing it thereon. Whichever the method of attachment, the seal formed at each surface's interface should be seamless to insure maximum EME shielding.

Figure 3:
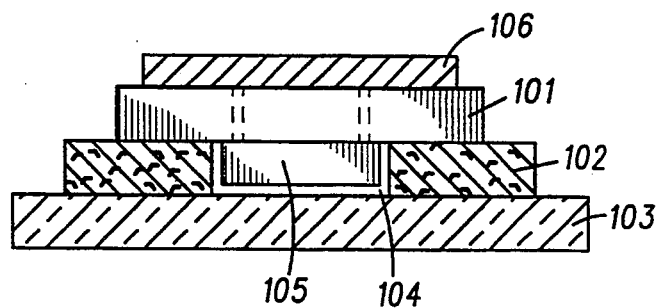
FIG. 3 illustrates a cross-sectional view of an electromagnetic shielding assembly in accordance with the present invention.

FIG. 3 illustrates a cross-sectional view of the fabricated EM shielding assembly 100. The substrate 101 is physically and electrically attached to the shielding plate 102 and the metallic shielding area 106 such that the circuit 105 is positioned within the cutout area 104 of the shielding plate 102 and the metallic shielding area 106 covers the cutout area 104. The metallic plate 103 is coupled to the shielding plate 102 such that it also covers the cutout area 104; thus, the circuit 105 is completely enclosed by the shielding plate 102, the metallic plate 103, and the metallic shielding area 106. Typical performance of an EM shielding assembly 100 that includes an 860 MHz microstrip lowpass filter circuit shows the assembly provides at least 25 dB rejection to the radiated carrier frequency in all three principle planes. This result closely approximates the response of a similar brass shield.

The EM shielding assembly 100 may be utilized in a variety of communication device applications. In a high power RF amplifier application, the EM shielding assembly 100 may encase a radiating output harmonic filter that cohabitates with several power amplifier circuits attached on one heat sink. The filter may be one circuit on a substrate that contains several circuits. The complete substrate 101 may be soldered to the shielding plate 102; thus, the cutout area 104 would define the location of the EM shielding assembly 100. In a low power RF application, the EM shielding assembly 100 may encase a susceptible mixer on an integrated circuit. In this situation, the metallic plate 103 would be deposited on the second major surface 203 of the shielding plate 102. Interconnections between the integrated circuit and other external circuits would be achieved via electrical connections to the input and output traces 107 and 108.

Figure 4:
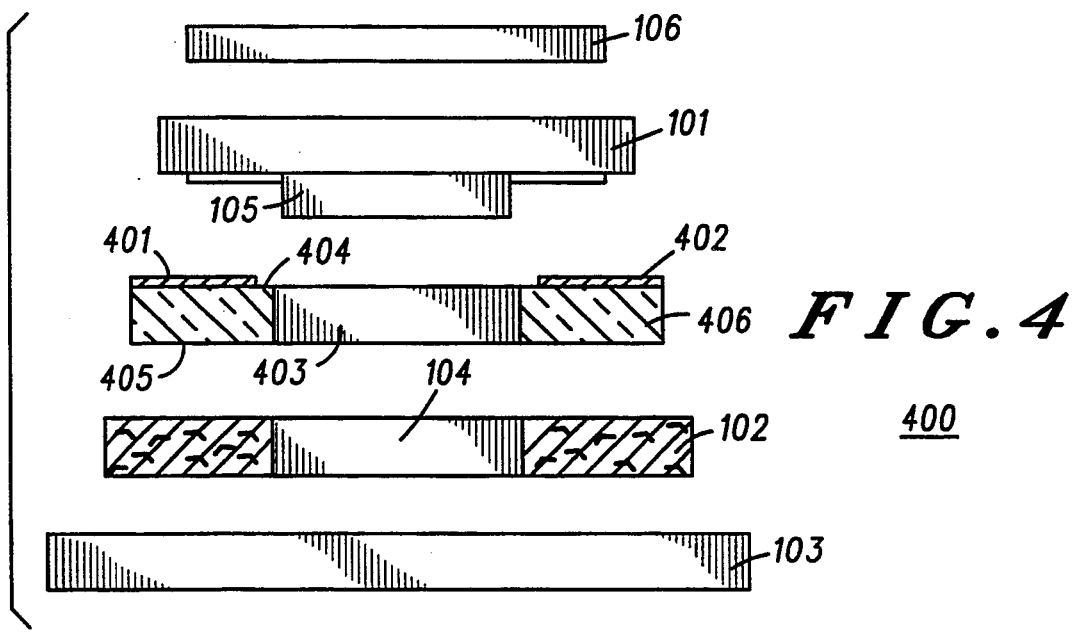
FIG. 4 illustrates an exploded cross-sectional view of an alternative embodiment for an electromagnetic shielding assembly in accordance with the present invention.

FIG. 4 illustrates an exploded cross-sectional view of an alternative EM shielding assembly 400. The EM shielding assembly 400 comprises the substrate 101, the shielding plate 102, the metallic plate 103, the metallic shielding area 106, and a second substrate 406. The second substrate 406 includes an input trace 401 and an output trace 402 deposited on a first major surface 404, a substrate cutout area 403 of substantially identical dimensions as the cutout area 104 in the shielding plate 102, and a second major surface 405 used to attach the second substrate 406 to the shielding plate 102. The second substrate 406 may comprise a printed circuit board or a ceramic material, such as alumina, and contain a high conductivity metal, such as silver or copper, on its second major surface 405 to aid in the attachment of the second substrate 406 to the shielding plate 102. The second substrate 406 may be any thickness provided the sum of its thickness and the thickness of the shielding plate 102 is larger than the height of the circuit 105. The input and output traces 401 and 402 are typically high conductivity metals that are coupled to the circuit 105 via an electrically conductive bonding agent (not shown), such as solder or conductive epoxy.

Figure 5:
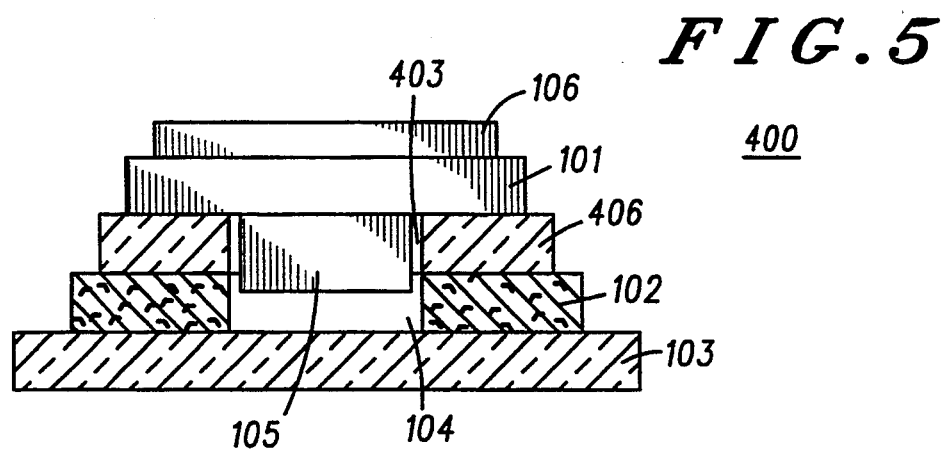
FIG. 5 illustrates a cross-sectional view of an alternative embodiment for an electromagnetic shielding assembly in accordance with the present invention.

FIG. 5 illustrates a cross-sectional view of the alternative EM shielding assembly 400. The second substrate 406 is physically and electrically attached to the shielding plate 102 and the substrate 101 such that the cutout areas 104 and 403 are sufficiently aligned and the circuit 105 is positioned within the cutout areas 104 and 403. As previously discussed with regard to FIG. 3, the metallic shielding area 106 is adhered to the substrate 101 and the metallic plate 103 is attached to the shielding plate 102 such that both the metallic shielding area 106 and the metallic plate 103 cover the cutout areas 104 and 403. As shown, the EM shielding assembly 400 completely encases the circuit 105 within the cutout areas 104 and 403. The metallic shielding area 106 may be electrically coupled to the shielding plate 102 via conductive traces wrapped around the edges of both the substrate 101 and the second substrate 406 or through plated feedthrough holes in both substrates 101 and 406. This EM assembly 400 eliminates the need to use feedthrough holes to provide access to the circuit 105.

The present invention provides an electromagnetic shielding assembly that provides a complete electromagnetic enclosure around a circuit that emits, or is sensitive to, electromagnetic energy. By eliminating the apertures typically required for metallic shields attached to printed circuit boards, the present invention achieves electromagnetic shielding which closely approximates the shielding obtained with a solid metal enclosure. An even closer approximation can be attained by plating the electrically conductive carbon composition shielding plate with a high conductivity metal such that the walls formed by the shielding plate's cutout area include the plating. The present invention does not require any additional parts, as does a printed circuit board with external metallic shields, because it utilizes the electrically conductive carbon composition shielding plate as both the walls of the shield and a carrier for the substrate. Further, compared to a metal shield, the electromagnetic shielding assembly provides better attenuation of guided electromagnetic modes due to the lower electrical conductivity of the electrically conductive carbon composition.

I claim:

1. An electromagnetic shielding assembly that comprises:

a substrate that has, deposited on a first major surface, at least one circuit that emits, or is sensitive to, electromagnetic energy and that has, adhered to a second major surface, a metallic shielding area, wherein the first major surface and the second major surface are substantially parallel separated by a thickness of the substrate and wherein the metallic shielding area has a predetermined shape;

an electrically conductive carbon composition shielding plate that has a predetermined thickness and a cutout area, wherein the first major surface of the substrate is physically and electrically attached to a first major surface of the electrically conductive carbon composition material, wherein the at least one circuit is positioned within the cutout area, and wherein the metallic shielding area substantially covers the cutout area; and a metallic plate having a predetermined thickness that is physically and electrically coupled to a second major surface of the electrically conductive carbon composition plate, wherein the second major surface of the electrically conductive carbon composition plate and the first major surface of the electrically conductive carbon composition plate are substantially parallel separated by the predetermined thickness of the electrically conductive carbon composition plate.

2. The electromagnetic shielding assembly of claim 1, wherein the metallic plate is deposited on the second major surface of the electrically conductive carbon composition plate.

3. The electromagnetic shielding assembly of claim 1, wherein the metallic plate comprises aluminum or copper.

4. The electromagnetic shielding assembly of claim 1, wherein the electrically conductive carbon composition plate comprises graphite.

5. The electromagnetic shielding assembly of claim 1, wherein the substrate further includes an input trace and an output trace deposited on the second major surface and operably coupled to the at least one circuit via feedthrough holes.

6. A communication device that includes an electromagnetic shielding assembly, wherein the electromagnetic shielding assembly comprises:

a substrate that has, deposited on a first major surface, at least one circuit that emits, or is sensitive to, electromagnetic energy and that has, adhered to a second major surface, a metallic shielding area, wherein the first major surface and the second major surface are substantially parallel separated by a thickness of the substrate and wherein the metallic shielding area has a predetermined shape;

an electrically conductive carbon composition shielding plate that has a predetermined thickness and a cutout area, wherein the first major surface of the substrate is physically and electrically attached to a first major surface of the electrically conductive carbon composition material, wherein the at least one circuit is positioned within the cutout area, and wherein the metallic shielding area substantially covers the cutout area; and a metallic plate having a predetermined thickness that is physically and electrically coupled to a second major surface of the electrically conductive carbon composition plate, wherein the second major surface of the electrically conductive carbon composition plate and the first major surface of the electrically conductive carbon composition plate are substantially parallel separated by the predetermined thickness of the electrically conductive carbon composition plate.

7. The communication device of claim 6, wherein the metallic plate is deposited on the second major surface of the electrically conductive carbon composition plate.

8. The communication device of claim 6, wherein the metallic plate comprises aluminum or copper.

9. The communications device of claim 6, wherein the electrically conductive carbon composition plate comprises graphite.

10. The communications device of claim 6, wherein the substrate further includes an input trace and an output trace deposited on the second major surface and operably coupled to the at least one circuit via feed-through holes.

11. An electromagnetic shielding assembly that comprises:
 a first substrate that has, deposited on a first major surface, at least one circuit that emits, or is sensitive to, electromagnetic energy and that has, adhered to a second major surface, a metallic shielding area, wherein the first major surface and the second major surface are substantially parallel separated by a thickness of the substrate and wherein the metallic shielding area has a predetermined shape:
 a second substrate that has a substrate cutout area and that has, deposited on a first major surface, an input trace and an output trace, wherein the first major surface of the first substrate is physically coupled to the first major surface of the second substrate, wherein the input trace and the output trace are electrically coupled to the at least one circuit, and wherein the circuit is positioned within the substrate cutout;
 an electrically conductive carbon composition shielding plate that has a predetermined thickness and a cutout area, wherein a second major surface of the second substrate is physically and electrically attached to a first major surface of the electrically conductive carbon composition material, wherein the at least one circuit is positioned within the cutout area, and wherein the metallic shielding area substantially covers the cutout area, and wherein the substrate cutout area and the cutout area have substantially identical dimensions; and
 a metallic plate having a predetermined thickness that is physically and electrically coupled to a second major surface of the electrically conductive carbon composition plate, wherein the second major surface of the electrically conductive carbon composition plate and the first major surface of the electrically conductive carbon composition plate are substantially parallel separated by the predetermined thickness of the electrically conductive carbon composition plate.

12. The electromagnetic shielding assembly of claim 11, wherein the metallic plate is deposited on the second major surface of the electrically conductive carbon composition plate.

13. The electromagnetic shielding assembly of claim 11, wherein the metallic plate comprises aluminum or copper.

14. The electromagnetic shielding assembly of claim 11, wherein the electrically conductive carbon composition plate comprises graphite.

* * * * *